United States Patent
Park et al.

(10) Patent No.: US 9,390,853 B2
(45) Date of Patent: Jul. 12, 2016

(54) MULTILAYER CERAMIC CAPACITOR AND MOUNTING BOARD THEREFOR

(71) Applicant: SAMSUNG ELECTRO-MECHANICS CO., LTD., Suwon, Gyunggi-do (KR)

(72) Inventors: Sang Soo Park, Gyunggi-do (KR); Heung Kil Park, Gyunggi-do (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 35 days.

(21) Appl. No.: 14/065,271

(22) Filed: Oct. 28, 2013

(65) Prior Publication Data

US 2015/0008024 A1 Jan. 8, 2015

(30) Foreign Application Priority Data

Jul. 5, 2013 (KR) .......... 10-2013-0079097

(51) Int. Cl.
| | |
|---|---|
| *H01G 4/228* | (2006.01) |
| *H01G 4/06* | (2006.01) |
| *H01G 4/005* | (2006.01) |
| *H01G 4/248* | (2006.01) |
| *H01G 4/01* | (2006.01) |

(Continued)

(52) U.S. Cl.
CPC ............... *H01G 4/01* (2013.01); *H01G 2/065* (2013.01); *H01G 4/30* (2013.01); *H05K 1/181* (2013.01)

(58) Field of Classification Search
CPC ........... H01G 4/01; H01G 4/30; H01G 2/065; H05K 1/181

USPC ............ 361/301.1, 301.4, 303, 306.1, 306.3, 361/310, 321.1, 321.2

See application file for complete search history.

(56) References Cited

U.S. PATENT DOCUMENTS 6,380,619 B2 * 4/2002 Ahiko et al. ............... 257/703
6,807,047 B2 10/2004 Togashi et al.

(Continued)

FOREIGN PATENT DOCUMENTS

| JP | 06-163311 A | 6/1994 |
|---|---|---|
| JP | 11-186092 A | 7/1999 |

(Continued)

OTHER PUBLICATIONS

Japanese Office Action issued in Japanese Patent Application No. 2013-209928 dated May 12, 2015, with English Translation.

(Continued)

*Primary Examiner* — Hoa C Nguyen
(74) *Attorney, Agent, or Firm* — McDermott Will & Emery LLP

(57) ABSTRACT

There is provided a multilayer ceramic capacitor including a ceramic body having first and second main surfaces, third and fourth end surfaces, and fifth and sixth side surfaces; a plurality of first and second internal electrodes having a dielectric layer to be alternately exposed to the third and fourth end surfaces; and first and second external electrodes formed on the end surfaces and the main surfaces and electrically connected to the first and second internal electrodes, wherein when a width of the first or second external electrode is A and a length of a margin part of the ceramic body in the length direction is B, a ratio (A/B) of the width of the first or second external electrode to the length of the margin part of the ceramic body in the length direction is 3.3 or less (A/B≤3.3).

4 Claims, 2 Drawing Sheets

(51) Int. Cl.
*H01G 2/06* (2006.01)
*H01G 4/30* (2006.01)
*H05K 1/18* (2006.01)

(56) References Cited

U.S. PATENT DOCUMENTS

| | | |
|---|---|---|
| 7,706,123 B2 | 4/2010 | Togashi et al. |
| 2001/0019176 A1* | 9/2001 | Ahiko et al. ............... 257/777 |
| 2002/0041006 A1* | 4/2002 | Ahiko et al. ............... 257/532 |
| 2004/0218373 A1* | 11/2004 | Ritter et al. ............... 361/792 |
| 2005/0057886 A1* | 3/2005 | Mruz ............... 361/306.2 |
| 2007/0025055 A1* | 2/2007 | Mizuno et al. ............... 361/303 |
| 2007/0096254 A1* | 5/2007 | Ritter et al. ............... 257/532 |
| 2012/0300361 A1 | 11/2012 | Togashi |
| 2013/0208399 A1* | 8/2013 | Morita et al. ............... 361/301.4 |
| 2013/0222972 A1* | 8/2013 | Saito et al. ............... 361/301.4 |
| 2013/0242456 A1* | 9/2013 | Lee et al. ............... 361/301.4 |
| 2013/0242462 A1 | 9/2013 | Kawano et al. |

FOREIGN PATENT DOCUMENTS

| | | |
|---|---|---|
| JP | 2000-150289 A | 5/2000 |
| JP | 2002-260949 A | 9/2002 |
| JP | 2004-288847 A | 10/2004 |
| JP | 2012-248581 A | 12/2012 |
| JP | 2013-197186 A | 9/2013 |
| KR | 20100100722 A | 9/2010 |

OTHER PUBLICATIONS

Japanese Office Action issued in Application No. 2013-209928 dfated Mar. 15, 2016, with English translation.

* cited by examiner

MULTILAYER CERAMIC CAPACITOR AND MOUNTING BOARD THEREFOR

CROSS-REFERENCE TO RELATED APPLICATION

This application claims the benefit of Korean Patent Application No. 10-2013-0079097 filed on Jul. 5, 2013, with the Korean Intellectual Property Office, the disclosure of which is incorporated herein by reference.

BACKGROUND OF THE INVENTION

1. Field of the Invention

The present invention relates to a multilayer ceramic capacitor and a mounting board thereof.

2. Description of the Related Art

Since a multilayer ceramic capacitor (MLCC), a multilayer chip electronic component, has advantages such as a small size, high capacitance and easiness of mounting, the multilayer ceramic capacitor may be used in various electronic devices.

For example, the multilayer ceramic capacitor may be used as a chip shaped condenser mounted on circuit boards of various electronic products such as a display device, for example, a liquid crystal display (LCD), a plasma display panel (PDP), and the like, a computer, a personal digital assistants (PDA), and a mobile phone to serve to charge electricity or discharge electricity.

Generally, the multilayer ceramic capacitor may have a structure in which a plurality of dielectric layers and internal electrodes having different polarities between the dielectric layers are alternately disposed.

In this case, since the dielectric layer has piezoelectricity, when direct current (DC) or alternate current (AC) voltage is applied to the multilayer ceramic capacitor, a piezoelectric phenomenon is generated between the internal electrodes, thereby generating periodic vibrations while expanding and contracting a volume of a ceramic body according to the frequency.

Such vibrations are transferred to a circuit board through an external electrode of the multilayer ceramic capacitor and a solder connecting the external electrode to the circuit board, such that the entire circuit board may become an acoustically reflective surface to generate vibration sound, noise.

In this case, the solder connecting the external electrode and the circuit board is inclined from both side surfaces and both end surfaces of the ceramic body along a surface of the external electrode at a predetermined height. As a volume and a height of the solder increase, vibrations of the multilayer ceramic capacitor may be further easily transferred to the circuit board, such that vibration sound may be further severe.

Such a vibration sound may have a frequency corresponding to an audible frequency in a region of 20 to 20,000 Hz causing a user discomfort. The vibration sound causing the user discomfort as described above is called acoustic noise.

Recently, in electronic devices, since acoustic noise generated in the multilayer ceramic capacitor as described above due to the tendency for low noise components may rather increase, research into technology for effectively reducing the acoustic noise generated in the multilayer ceramic capacitor has been required.

Although a multilayer ceramic capacitor is disclosed in the following Related Art document, contents limiting a ratio of a width of an external electrode to a length of margin part of a ceramic body in a length direction are not disclosed therein.

RELATED ART DOCUMENT

Korean Patent Laid-Open Publication No. 10-2010-0100722

SUMMARY OF THE INVENTION

An aspect of the present invention provides a multilayer ceramic capacitor capable of reducing acoustic noise generated when vibrations generated due to a piezoelectric phenomenon are transferred to a circuit board through an external electrode and a solder.

According to an aspect of the present invention, there is provided a multilayer ceramic capacitor including: a ceramic body including a plurality of dielectric layers and having first and second main surfaces opposing each other in a thickness direction of the ceramic body, third and fourth end surfaces in a length direction thereof, and fifth and sixth side surfaces in a width direction thereof; a plurality of first and second internal electrodes disposed in the ceramic body, having the dielectric layer interposed therebetween, to be alternately exposed to the third and fourth end surfaces; and first and second external electrodes formed on the end surfaces and the main surfaces of the ceramic body in the length and thickness directions and electrically connected to the first and second internal electrodes, wherein when a width of the first or second external electrode is defined as A and a length of a margin part of the ceramic body in the length direction is defined as B, a ratio (A/B) of the width of the first or second external electrode to the length of the margin part of the ceramic body in the length direction is 3.3 or less (A/B≤3.3).

The width of the first and second external electrodes may be narrower than that of the ceramic body.

The ceramic body may further include upper and lower cover layers respectively formed on upper and lower portions of an active layer in which the first and second internal electrodes are disposed.

According to an aspect of the present invention, there is provided a mounting board for a multilayer ceramic capacitor, the mounting board including: a circuit board including first and second electrode pads formed thereon; and at least one multilayer ceramic capacitor mounted on the circuit board, wherein the multilayer ceramic capacitor includes a ceramic body including a plurality of dielectric layers and having first and second main surfaces opposing each other in a thickness direction of the ceramic body, third and fourth end surfaces in a length direction thereof, and fifth and sixth side surfaces in a width direction thereof; a plurality of first and second internal electrodes disposed in the ceramic body, having the dielectric layer interposed therebetween, to be alternately exposed to the third and fourth end surfaces; and first and second external electrodes formed on the end surfaces and the main surfaces of the ceramic body in the length and thickness directions and electrically connected to the first and second internal electrodes, and when a width of the first or second external electrode is defined as A and a length of a margin part of the ceramic body in the length direction is defined as B, a (A/B) of the width of the first or second external electrode to the length of the margin part of the ceramic body in the length direction is 3.3 or less (A/B≤3.3).

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
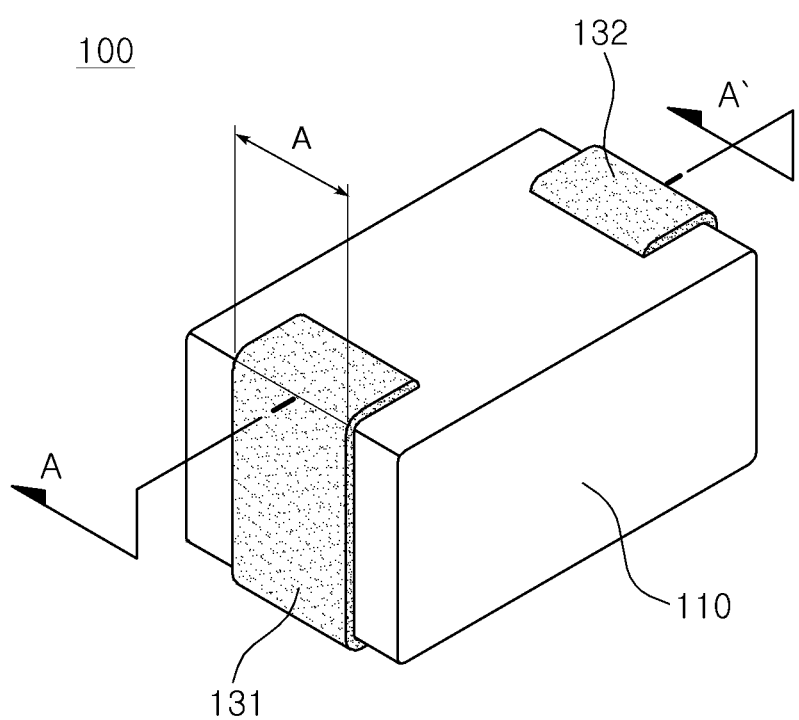
FIG. 1 is a perspective view schematically showing a multilayer ceramic capacitor according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 2:
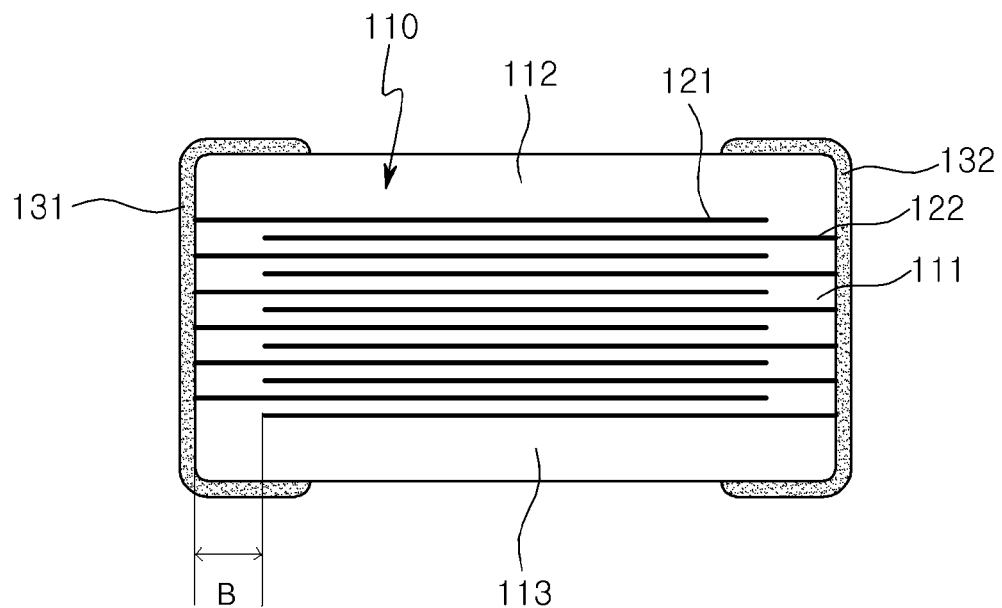
FIG. 2 is a cross-sectional view taken along line A-A' of FIG. 1.

FIG. 1 is a perspective view schematically showing a multilayer ceramic capacitor according to an embodiment of the present invention, and FIG. 2 is a cross-sectional view taken along line A-A' of FIG. 1.

Referring to FIGS. 1 and 2, the multilayer ceramic capacitor 100 according to the embodiment of the present invention may include a ceramic body 110 in which a plurality of dielectric layers 111 are stacked in a thickness direction, a plurality of first and second internal electrodes 121 and 122, and first and second external electrodes 131 and 132 electrically connected to the first and second internal electrodes 121 and 122, respectively.

The ceramic body 110 may be formed by stacking and then firing the plurality of dielectric layers 111, wherein the dielectric layers 111 may be integrated so as not to confirm a boundary between the dielectric layers 111 adjacent to each other.

In addition, the ceramic body 110 may have a hexahedral shape. Directions of a hexahedron will be defined in order to clearly describe the embodiments of the present invention. L, W and T shown in FIG. 1 refer to a length direction of the hexahedron, a width direction thereof, and a thickness direction thereof, respectively.

In the present embodiment, end surfaces of the ceramic body 110 opposing each other in the thickness direction, that is, a direction in which the dielectric layers are stacked, may be defined as first and second main surfaces, end surfaces connecting the first and second main surfaces and opposing each other in the length direction may be defined as third and fourth end surfaces, and surfaces opposing each other in the width direction may be defined as fifth and sixth side surfaces.

In this case, in a cross section of the multilayer ceramic capacitor 100 in a length-thickness direction, a portion in which the internal electrodes are disposed to form capacitance may be defined as an active layer, and portions except for the active layer may be defined as margin parts.

Among the margin parts, particularly, upper and lower margin parts of the active layer in the thickness direction may be defined as upper and lower cover layers 112 and 113, respectively.

The upper and lower cover layers 112 and 113 may be formed by sintering a ceramic sheet similarly to the dielectric layer 111 formed between the first and second internal electrodes 121 and 122.

In addition, the plurality of dielectric layers including the upper and lower cover layers 112 and 113 may be in a sintered state, and adjacent dielectric layers may be integrated so as to be difficult to confirm a boundary therebetween without using a scanning electron microscope (SEM).

The dielectric layer 111 may contain a ceramic material having high permittivity, for example, barium titanate (BaTiO$_3$)-based ceramic powder, or the like, but the present invention is not limited thereto as long as sufficient capacitance may be obtained.

In addition, the dielectric layer 111 may further contain various ceramic additives such as transition metal oxides or carbides, a rare earth element, magnesium (Mg), aluminum (Al), or the like, an organic solvent, a plasticizer, a binder, a dispersant, or the like, in addition to the ceramic powder, as needed.

The first and second internal electrodes 121 and 122 having different polarities may be formed on at least one surface of the ceramic sheet forming the dielectric layer 111, to be stacked thereon, and may be disposed in the ceramic body 110, having each dielectric layer 111 therebetween, to be alternately exposed to the third and fourth end surfaces.

In this case, the first and second internal electrodes 121 and 122 may be electrically insulated from each other by the dielectric layer 111 disposed therebetween, and the capacitance of the multilayer ceramic capacitor 100 may be in proportion to an area of the first and second internal electrodes 121 and 122 overlapped with each other in the direction in which the dielectric layers 111 are stacked.

In addition, the first and second internal electrodes 121 and 122 may be formed of a conductive metal, for example one of silver (Ag), lead (Pb), platinum (Pt), nickel (Ni) and copper (Cu), an alloy thereof, or the like, but the present invention is not limited thereto.

The first and second external electrodes 131 and 132 may be formed to cover portions of the first and second internal electrodes 121 and 122 exposed to the third and fourth end surfaces of the ceramic body 110 to thereby be electrically connected thereto, respectively.

The first and second external electrodes 131 and 132 as described above may be extended from the third and fourth end surfaces of the ceramic body 110 to the first and second main surfaces, as illustrated in the cross-section of the ceramic body 110 in the length-thickness direction.

In addition, the first and second external electrodes 131 and 132 may be formed of a conductive metal, for example, one of silver (Ag), lead (Pb), platinum (Pt), nickel (Ni) and copper (Cu), an alloy thereof, or the like, but the present invention is not limited thereto.

Further, the first and second external electrodes 131 and 132 may be formed to have a width A narrower than that of the ceramic body 110.

In this case, when the width of the first or second external electrode 131 or 132 is defined as A, and a length of a margin part in the length direction of the ceramic body 110 is defined as B, a ratio (A/B) of the width of the first or second external electrode 131 or 132 to the length of the margin part in the length direction of the ceramic body 110 may be 3.3 or less (A/B≤3.3).

Meanwhile, surfaces of the first and second external electrodes 131 and 132 may be provided with first and second plating layers (not shown) formed thereon, as needed.

The first and second plating layers may include nickel (Ni) plating layers formed on the first and second external electrodes 131 and 132 and tin (Sn) plating layers formed on the nickel plating layers.

The first and second plating layers as described above is to increase adhesion strength between the multilayer ceramic capacitor 100 and a circuit board at the time of mounting the multilayer ceramic capacitor 100 on the circuit board, or the like, by solder or the like. A plating treatment may be performed by a known method, and lead-free plating may be performed in consideration of eco-friendly factors, but the present invention is not limited thereto.

The multilayer ceramic capacitor 100 configured as described above may configure a mounting board for a multilayer ceramic capacitor together with a circuit board and first and second electrode pads formed on the circuit board to be spaced apart from each other.

In this case, the multilayer ceramic capacitor 100 may be electrically connected to the circuit board by solder in a state in which the first and second external electrodes 131 and 132 are positioned on the first and second electrode pads to contact each other.

Figure 3:
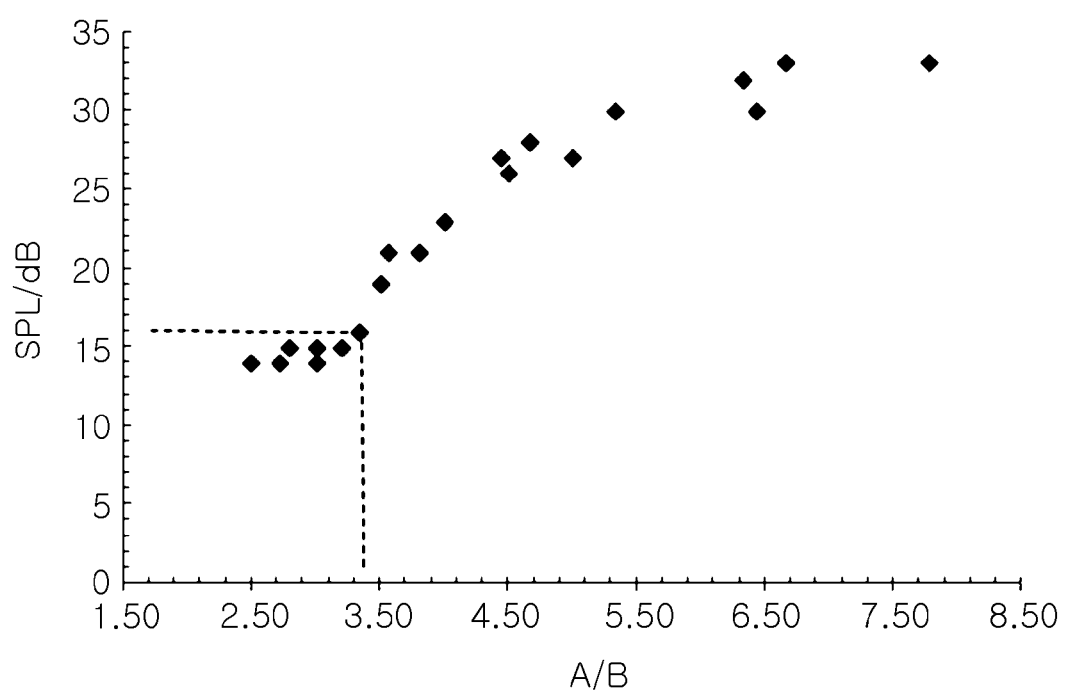
FIG. 3 is a graph showing a sound pressure level (SPL) according to a ratio of a width of an external electrode to a length of a margin part of a ceramic body in a length direction in the multilayer ceramic capacitor according to the embodiment of the present invention.

The follow Table 1 shows a sound pressure level (SPL) according to a ratio of a width of an external electrode to a length of a margin part of a ceramic body in a length direction of the ceramic body in the mounting board for a multilayer ceramic capacitor according to the embodiment of the present invention, and FIG. 3 is a graph showing the sound pressure level (SPL) according to the ratio of the width of the external electrode to the length of the margin part of the ceramic body in the length direction in the multilayer ceramic capacitor according to the embodiment of the present invention.

TABLE 1

| L (mm) | W (mm) | T (mm) | A (mm) | B (mm) | A/B | SPL (dB) |
|---|---|---|---|---|---|---|
| 1.0 | 0.5 | 0.5 | 0.45 | 0.07 | 6.43 | 30 |
| 1.0 | 0.5 | 0.5 | 0.35 | 0.07 | 5.00 | 27 |
| 1.0 | 0.5 | 0.5 | 0.25 | 0.07 | 3.57 | 21 |
| 1.0 | 0.5 | 0.5 | 0.45 | 0.10 | 4.50 | 26 |
| 1.0 | 0.5 | 0.5 | 0.35 | 0.10 | 3.50 | 19 |
| 1.0 | 0.5 | 0.5 | 0.25 | 0.10 | 2.50 | 14 |
| 1.0 | 0.5 | 0.5 | 0.45 | 0.15 | 3.00 | 14 |
| 1.6 | 0.8 | 0.8 | 0.7 | 0.09 | 7.78 | 33 |
| 1.6 | 0.8 | 0.8 | 0.6 | 0.09 | 6.67 | 33 |
| 1.6 | 0.8 | 0.8 | 0.4 | 0.09 | 4.44 | 27 |
| 1.6 | 0.8 | 0.8 | 0.7 | 0.15 | 4.67 | 28 |
| 1.6 | 0.8 | 0.8 | 0.6 | 0.15 | 4.00 | 23 |
| 1.6 | 0.8 | 0.8 | 0.5 | 0.15 | 3.33 | 16 |
| 1.6 | 0.8 | 0.8 | 0.6 | 0.20 | 3.00 | 15 |
| 1.6 | 0.8 | 0.8 | 0.7 | 0.25 | 2.80 | 15 |
| 2.0 | 1.25 | 1.25 | 0.95 | 0.15 | 6.33 | 32 |
| 2.0 | 1.25 | 1.25 | 0.8 | 0.15 | 5.33 | 30 |
| 2.0 | 1.25 | 1.25 | 0.95 | 0.25 | 3.80 | 21 |
| 2.0 | 1.25 | 1.25 | 0.8 | 0.25 | 3.20 | 15 |
| 2.0 | 1.25 | 1.25 | 0.95 | 0.35 | 2.71 | 14 |

Referring to FIG. 3 and Table 1, in the present embodiment, when a width of a first or second external electrode 131 or 132 is defined as A, and a length of a margin part of the ceramic body 110 in the length direction thereof is defined as B, in the case in which a ratio (A/B) of the width of the first or second external electrode 131 or 132 to the length of the margin part of the ceramic body in the length direction of the ceramic body is 3.3 or less (A/B≤3.3), acoustic noise due to vibrations generated by a piezoelectric phenomenon and transferred to the circuit board through the first and second external electrodes 131 and 132 and the solder may be reduced, thereby realizing a noiseless design.

As set forth above, according to the embodiment of the present invention, acoustic noise due to vibrations generated by the piezoelectric phenomenon in the multilayer ceramic capacitor and transferred to the circuit board through the external electrode and the solder may be reduced by limiting the ratio of the width of the external electrode to the length of the margin part of the ceramic body in the length direction.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
a ceramic body including a plurality of dielectric layers and having first and second main surfaces opposing each other in a thickness direction of the ceramic body, third and fourth end surfaces in a length direction thereof, and fifth and sixth side surfaces in a width direction thereof;
a plurality of first and second internal electrodes disposed in the ceramic body, having the dielectric layer interposed therebetween, to be alternately exposed to the third and fourth end surfaces; and
first and second external electrodes formed only on the end surfaces and the main surfaces of the ceramic body in the length and thickness directions and electrically connected to the first and second internal electrodes,
wherein when a width of the first or second external electrode is defined as A and a length of a margin part of the ceramic body in the length direction is defined as B, a ratio (A/B) of the width of the first or second external electrode to the length of the margin part of the ceramic body in the length direction is 3.3 or less (A/B≤3.3), and
wherein the width of the first and second external electrodes is narrower than that of the ceramic body.

2. The multilayer ceramic capacitor of claim 1, wherein the ceramic body further includes upper and lower cover layers respectively formed on upper and lower portions of an active layer in which the first and second internal electrodes are disposed.

3. A mounting board for a multilayer ceramic capacitor, the mounting board comprising:
a circuit board including first and second electrode pads formed thereon; and
at least one multilayer ceramic capacitor mounted on the circuit board,
wherein the multilayer ceramic capacitor includes a ceramic body including a plurality of dielectric layers and having first and second main surfaces opposing each other in a thickness direction of the ceramic body, third and fourth end surfaces in a length direction thereof, and fifth and sixth side surfaces in a width direction thereof;
a plurality of first and second internal electrodes disposed in the ceramic body, having the dielectric layer interposed therebetween, to be alternately exposed to the third and fourth end surfaces; and first and second external electrodes formed only on the end surfaces and the main surfaces of the ceramic body in the length and thickness directions and electrically connected to the first and second internal electrodes, and when a width of the first or second external electrode is defined as A and a length of a margin part of the ceramic body in the length direction is defined as B, a ratio (A/B) of the width of the first or second external electrode to the length of the margin part of the ceramic body in the length direction is 3.3 or less (A/B≤3.3), wherein the width of the first and second external electrodes is narrower than that of the ceramic body.

4. The mounting board of claim 3, wherein the multilayer ceramic capacitor further includes upper and lower cover layers respectively formed on upper and lower portions of an active layer of the ceramic body in which the first and second internal electrodes are disposed.

* * * * *